United States Patent [19]
Park et al.

[11] Patent Number: 5,885,883
[45] Date of Patent: Mar. 23, 1999

[54] METHODS OF FORMING TRENCH-BASED ISOLATION REGIONS WITH REDUCED SUSCEPTIBILITY TO EDGE DEFECTS

[75] Inventors: Moon-han Park, Kyungki-do; Yu-gyun Shin, Seoul, both of Rep. of Korea

[73] Assignee: Samsung Electronics Co., Ltd., Suwon, Rep. of Korea

[21] Appl. No.: 834,245

[22] Filed: Apr. 15, 1997

[30] Foreign Application Priority Data

Apr. 15, 1996 [KR] Rep. of Korea .................. 1996 11290

[51] Int. Cl.$^6$ ..................................................... H01L 21/76
[52] U.S. Cl. ........................... 438/435; 438/444; 438/426
[58] Field of Search ................................... 438/426, 444, 438/227, 232, 424, 435

[56] References Cited

U.S. PATENT DOCUMENTS

| | | |
|---|---|---|
| 4,636,281 | 1/1987 | Buiguez et al. . |
| 5,679,599 | 10/1997 | Mehta . |
| 5,712,502 | 1/1998 | Park et al. . |

OTHER PUBLICATIONS

Wolf, S., "Silicon Processing for the VLSI Era:vol. 2, Process Technology", Lattice Press, pp. 23–28 1990.

*Primary Examiner*—George Fourson
*Attorney, Agent, or Firm*—Myers Bigel Sibley & Sajovec

[57] ABSTRACT

Methods of forming trench-based isolation regions with reduced susceptibility to edge defects include the steps of forming trenches at a face of a semiconductor substrate and then filling the trenches with electrically insulating regions. However, to prevent exposure of those portions of the substrate extending adjacent the trenches, supplemental oxide regions are formed at the interfaces between the upper portions of the trench sidewalls and the electrically insulating regions in the trenches, by exposing the electrically insulating regions to an oxidation atmosphere at a temperature in a range between about 950° C. and 1100° C. In particular, the supplemental oxide regions are formed as thermal oxides of higher density than the electrically insulating regions in the trenches. Thus, the supplemental oxide regions are more resistant to chemical etchants. Accordingly, when the electrically insulating regions are planarized and etched during back end processing steps, the supplemental oxide regions will not be entirely etched and, therefore, those portions of the substrate (i.e., active regions) extending adjacent the trenches will not be exposed.

15 Claims, 6 Drawing Sheets

METHODS OF FORMING TRENCH-BASED ISOLATION REGIONS WITH REDUCED SUSCEPTIBILITY TO EDGE DEFECTS

FIELD OF THE INVENTION

The present invention relates to semiconductor devices and fabrication methods, and more particularly to methods of forming electrically isolated semiconductor active regions in a semiconductor substrate.

BACKGROUND OF THE INVENTION

Device isolation techniques play an important role in the design and performance of highly integrated semiconductor circuits by electrically isolating regions and devices therein from adjacent devices and regions. Moreover, as the degree of integration in semiconductor circuits increases, there is a concomitant need to develop techniques for forming isolation regions which are free of defects and can be scaled to provide isolation regions having smaller dimensions, but without sacrificing the isolation capability of the regions.

LOCal Oxidation of Silicon (LOCOS) and Shallow Trench Isolation (STI) are commonly used techniques for forming isolation regions in semiconductor substrates. The LOCOS technique has been widely used because it is relatively simple, however, the LOCOS technique has limitations. In particular, when applied to highly integrated devices such as 256M DRAM devices, oxide thinning and punch-through parasitics may become severe.

To address some of these limitations, STI techniques which include the formation of trench isolation regions have been considered. For example, FIGS. 1A to 1F are cross-sectional views of intermediate structures illustrating a conventional STI technique. In particular, referring to FIG. 1A, a pad oxide film pattern 12 and a silicon nitride film pattern 14 are formed by patterning a pad oxide film and a silicon nitride film to expose a portion of a semiconductor substrate 10 which is to become an isolation region. Then, as shown in FIG. 1B, a trench 16 is formed by etching the semiconductor substrate to a depth of about 3,000 Å to 5,000 Å using the silicon nitride film pattern 14 as an etching mask. Referring now to FIG. 1C, an insulating material layer 20 is formed in the trench 16, and then, as shown in FIG. 1D, a first isolation oxide 22 is formed by etching the insulating material layer 20 until the surface of the silicon nitride film pattern 14 is exposed. After this, as shown in FIG. 1E, the silicon nitride film pattern 14 is removed to define a second isolation oxide 23. Finally, referring to FIG. 1F, the pad oxide film pattern 12 is removed to define a third isolation oxide 24.

The highlighted regions designated as "A" in FIG. 1E and "B" in FIG. 1F show the upper recessed edges of the second and third isolation oxides after removing the silicon nitride film pattern 14 and the pad oxide film pattern 12. As illustrated by region "A", after removing the silicon nitride film pattern 14, the second isolation oxide 23 is in a state in which the edge portion thereof is cut as much as the thickness (t) from the first isolation oxide 22 of FIG. 1D. Also, as illustrated by region B, after removing the pad oxide film pattern 12, the third isolation oxide 24 is in a state in which the edge portion thereof is further cut relative to the second isolation oxide 23 of FIG. 1E. This is because the edge portion of the first isolation oxide 22 is etched to a certain thickness when the silicon nitride film pattern 14 and the pad oxide film pattern 12 are removed. As a result, the upper sidewall portion of the active region (i.e., the upper sidewall portion of the trench 16 which is illustrated as region "C" of FIG. 1F) may be exposed.

Also, there are problems in that the portion of the active region adjacent to the trench 16 is typically formed with a sharp edge. Hereinafter, the problems generated by a sharp edge at the edge of an active region and an exposed upper sidewall of an isolation trench 16 are described. First, a parasitic "hump" phenomenon may occur. The hump phenomenon means that the turn-on characteristics of a transistor formed in the active region may be deteriorated because of the presence of a parasitic transistor (adjacent the sidewall portions of the active region) having a relatively low threshold voltage. Second, an inverse narrow-width effect is generated. The inverse narrow-width effect is also a parasitic phenomenon which lowers the effective threshold voltage as the width of a gate electrode becomes narrower by a strong electric field generated at the sharp edge of the active region. Third, a gate oxide thinning phenomenon is generated whereby the gate oxide film formed at the sharp edge portion of the active region is thinner than the gate oxide film formed in another portion removed from the edge portion. This thinner gate oxide film increases the likelihood of dielectric breakdown which can deteriorate the characteristics of devices formed in the active region.

Thus, notwithstanding the above described methods, there continues to be a need for improved methods of forming field oxide isolation regions.

SUMMARY OF THE INVENTION

It is therefore an object of the present invention to provide improved methods of forming semiconductor devices having trench isolation regions therein.

It is another object of the present invention to provide methods of forming trench isolation regions with reduced susceptibility to edge defects.

These and other objects, features and advantages of the present invention are provided by methods of forming electrical isolation regions which include the steps of forming trenches at a face of a semiconductor substrate and then filling the trenches with electrically insulating regions. However, to prevent exposure of those portions of the substrate extending adjacent the trenches, supplemental oxide regions are formed at the interfaces between the upper portions of the trench sidewalls and the electrically insulating regions in the trenches, by exposing the electrically insulating regions to an oxidation atmosphere at a temperature in a range between about 950° C. and 1100° C. In particular, according to one embodiment of the present invention, the supplemental oxide regions are formed as thermal oxides of higher density than the electrically insulating regions in the trenches. Thus, the supplemental oxide regions are more resistant to chemical etchants. Accordingly, when the electrically insulating regions are planarized and etched during back end processing steps, the supplemental oxide regions will not be entirely etched and, therefore, those portions of the substrate (i.e., active regions) extending adjacent the trenches will not be exposed.

DESCRIPTION OF PREFERRED EMBODIMENTS

Figure 1A:
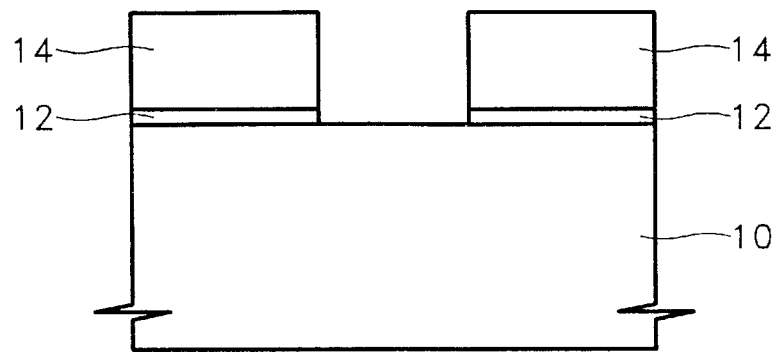
FIGS. 1A–1F illustrate schematic cross-sectional views of intermediate structures illustrating a method of forming trench-based isolation regions according to the prior art.
Figure 1B:
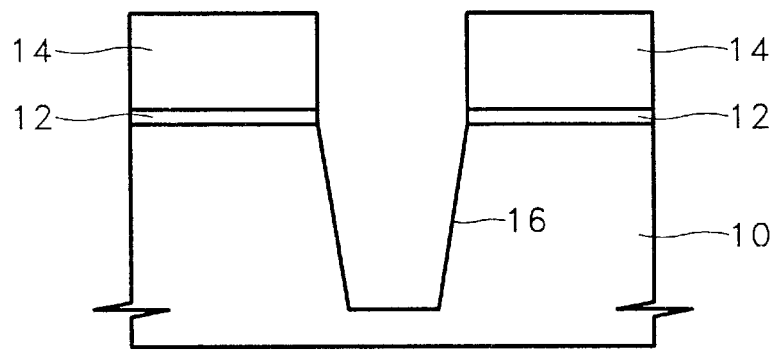
Figure 1C:
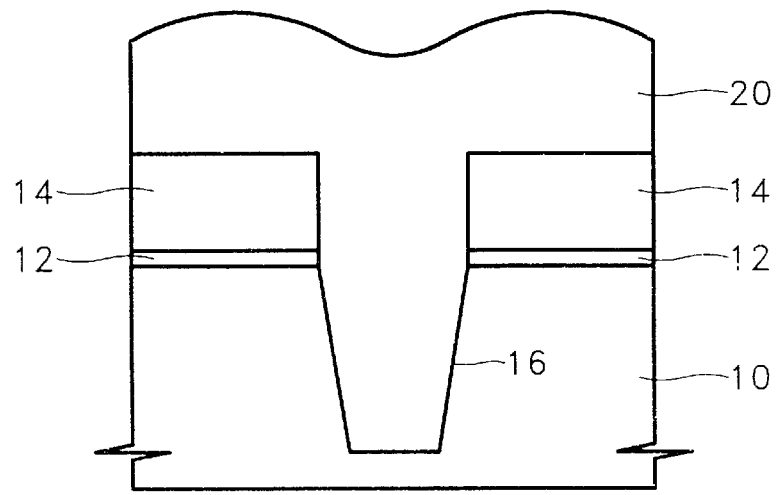
Figure 1D:
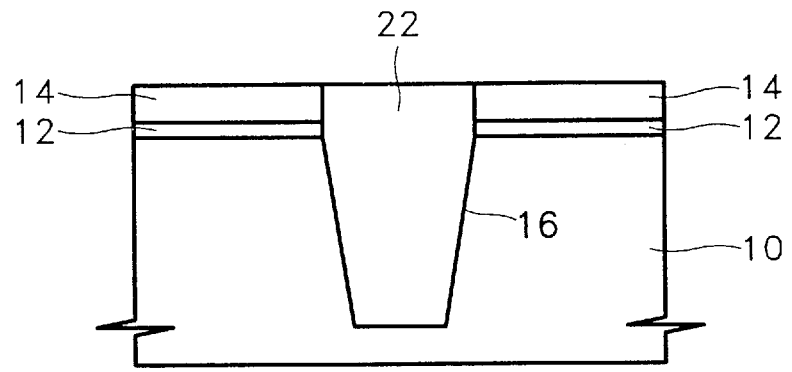
Figure 1E:
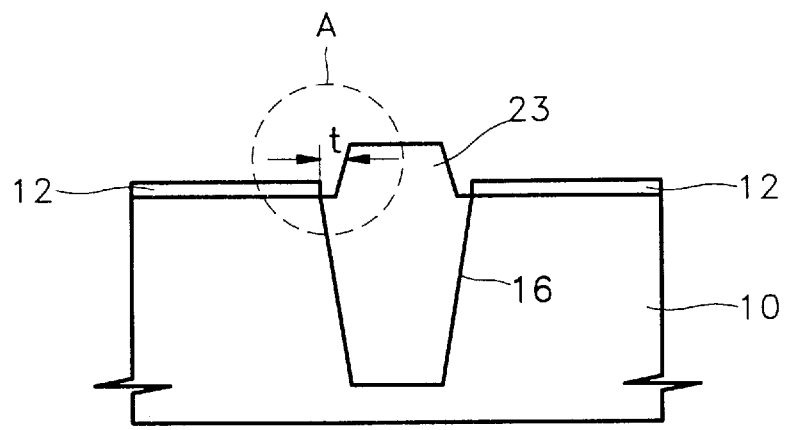
Figure 1F:
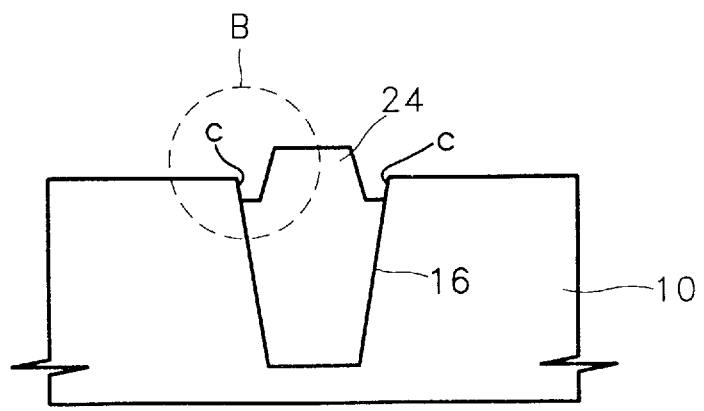

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 2A:
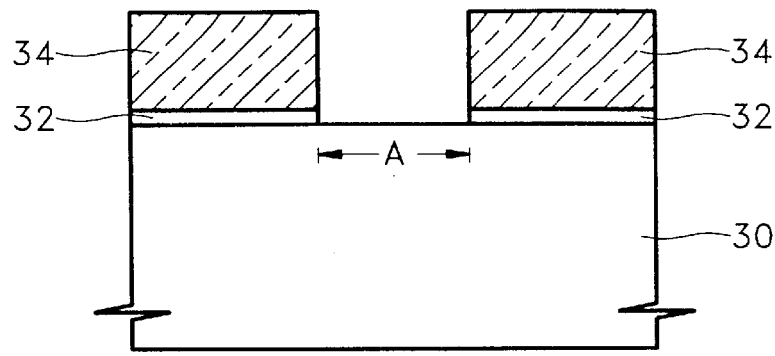
FIGS. 2A–2F illustrate schematic cross-sectional views of intermediate structures illustrating methods of forming trench-based isolation regions according to a first embodiment of the present invention.

Referring now to FIGS. 2A to 2F, methods of forming trench-based isolation regions according to a first embodiment of the present invention will be described. In particular, FIG. 2A shows the steps of forming a pad oxide film pattern 32 on a face of a semiconductor substrate 30 and an etching stop layer pattern 34 on the pad oxide film pattern 32, using conventional techniques. Here, the pad oxide film pattern 32 and the etching stop layer pattern 34 may be formed to expose a predetermined portion "A" of the face of the semiconductor substrate 30 in which a preferred trench isolation region is to be subsequently formed. The pad oxide film pattern 32 may be formed to a thickness of about 300 Å by oxidizing the face of the semiconductor substrate 30 and then using conventional photolithography steps to form the pattern. The etching stop layer pattern 34 may be formed by depositing a blanket layer of a material such as silicon nitride which has an etching selectivity greater than that of the semiconductor substrate 30. The etching stop layer pattern 34 may be formed to have a thickness in a range between about 1,000 Å and 4,000 Å. Preferably, the pad oxide film pattern 32 and the etching stop layer pattern 34 are formed during the same photolithography step. At this time, a material layer (not shown) whose etching selectivity is greater than that of the semiconductor substrate 30 (e.g., an oxide film) may be further deposited and patterned on the etching stop layer pattern 34 so that it may be used as an additional etching mask.

Figure 2B:
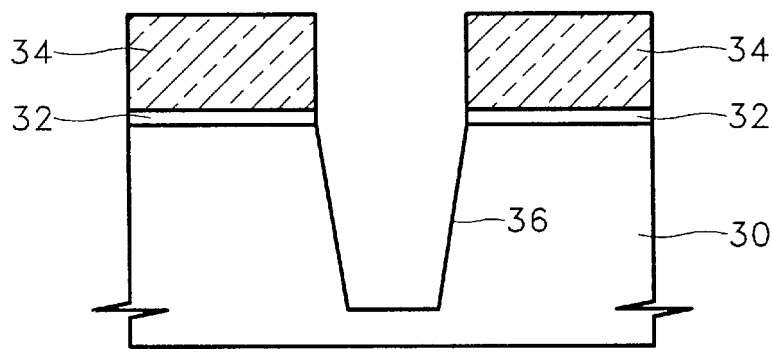
Figure 2C:
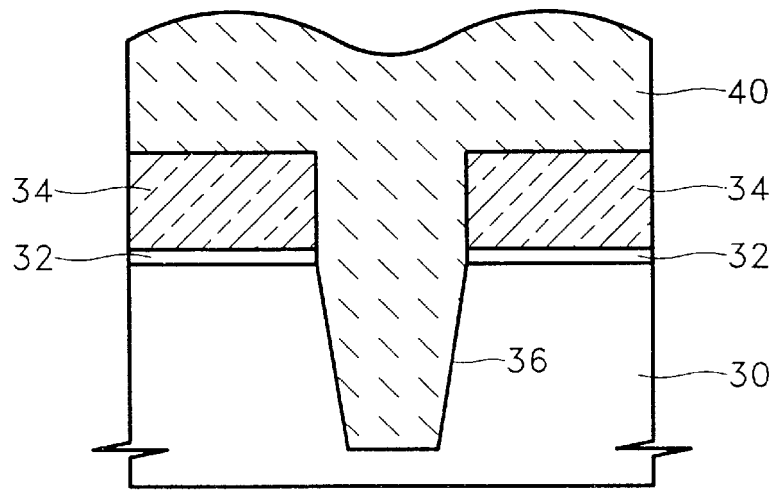
Figure 2D:
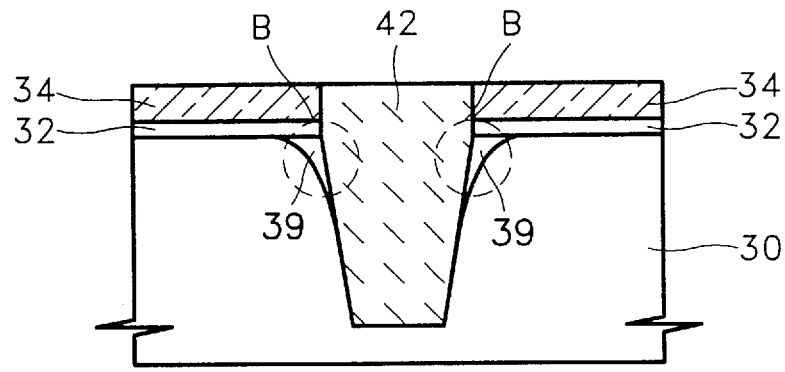

FIG. 2B shows the step of forming a trench 36. The trench 36 may be formed to a depth in a range between about 3000–5000 Å by anisotropically etching the semiconductor substrate 30 using the etching stop layer pattern 34 as an etching mask. FIG. 2C shows the step of forming an insulating material layer 40 in the trench 36 by depositing an insulating material on the entire surface of the substrate 30 having the trench 36 therein, to completely fill the trench 36. The insulating material layer 40 may be formed by depositing a layer of oxide using a chemical vapor deposition (CVD) technique. FIG. 2D shows the steps of forming a supplemental oxide film 39 by etching the insulating material layer 40 until the etching stop layer pattern 34 is exposed and a first trench isolation region 42 is defined and then exposing the substrate and first trench isolation region 42 to an atmosphere containing oxygen (e.g., $O_2$). The step of etching the insulating material layer 40 may be performed using a chemical-mechanical polishing (CMP) technique. At this time, the etching stop layer pattern 34 as well as the insulating material layer 40 of FIG. 2C are etched to a predetermined thickness.

The supplemental oxide film 39 is preferably formed under conditions in which defects caused by stress are not further generated in the semiconductor substrate 30 or the first trench isolation region 42. In the present invention, the step of exposing the substrate 30 and the first trench isolation region 42 to an oxygen containing atmosphere is preferably performed at a temperature in the range between about 950° C. and 1,100° C. In particular, at a temperature of about 950° C., the oxide material may show visco-elastic behavior. Thus, the supplemental oxide film 39 may be able to compensate for any stresses which may be present in the etching stop layer pattern 34 and the first trench isolation region 42.

Also, the supplemental oxide film 39 is formed to be sufficiently thick so that the semiconductor substrate 30 is not deteriorated and defects are not generated in the substrate 30 due to any possible volume expansion which might occur during the oxidation process for forming the supplemental oxide film 39. In the present invention, the supplemental oxide film 39 is formed to a thickness in the range of about 100 Å to 500 Å, and more particularly to about 500 Å.

The supplemental oxide film 39 is formed to be thicker in the upper sidewall portions of the trench 36 than in the lower sidewall portion of the trench 36, as shown in FIG. 2D. This is because the upper sidewall portions of the trench and substrate 30, close to the surface of the first trench isolation region 42, are more readily oxidized by oxygen atoms passing through the first trench isolation region 42. Accordingly, the profile of the edge portion of the active region (which is marked as region "B") shows a gradual slope, unlike conventional technology which results in a sharp edge (refer to FIGS. 1A to 1F).

The processing steps for forming the supplemental oxide film 39 and the effects of the supplemental oxide film 39 are as follows. First, it is possible to reduce the amount by which the first trench isolation region 42 is etched because the density of the oxide in the first trench isolation region 42 is increased when the supplemental oxide film 39 is formed. This means that the first trench isolation region 42 is not as easily etched by the wet etchant used to remove the etching stop layer pattern 34 and the pad oxide film pattern 32. Accordingly, the likelihood that the upper portions of the sidewalls of the trench 36 will be exposed during the wet etching step is reduced. Second, it is possible to make the edge portion of the active region rounded since the supplemental oxide film 39 on the upper sidewall portions (marked as region "B") of the trench 36 is formed to be thicker than on the other lower portions of the sidewalls of the trench 36. Thus, it is possible to reduce the magnitude of the electric fields concentrated on the edge portions of the active regions on opposing sides of the trench 36.

The forming conditions and the thickness of the supplemental oxide film 39 are most preferably restricted to the conditions set forth above, however, the preferred aspects of the present invention can be achieved if the supplemental oxide film 39 is formed under conditions and to a predetermined thickness so that defects are not generated in the first trench isolation region 42 and the semiconductor substrate 30. Therefore, it is clearly understood for anyone skilled in the art that the scope of the present invention is not necessarily restricted by the above numerical conditions.

Figure 2E:
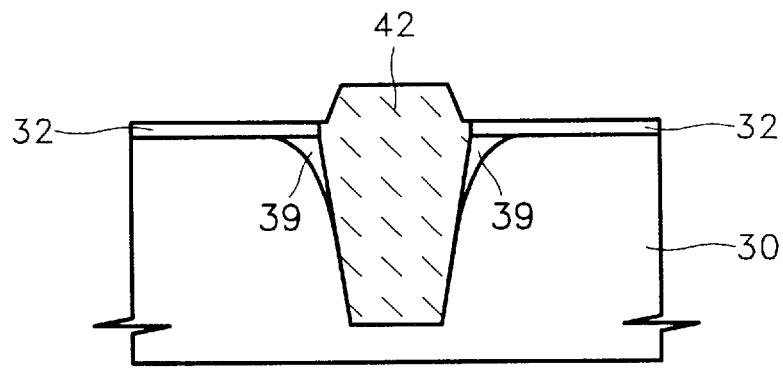
Figure 2F:
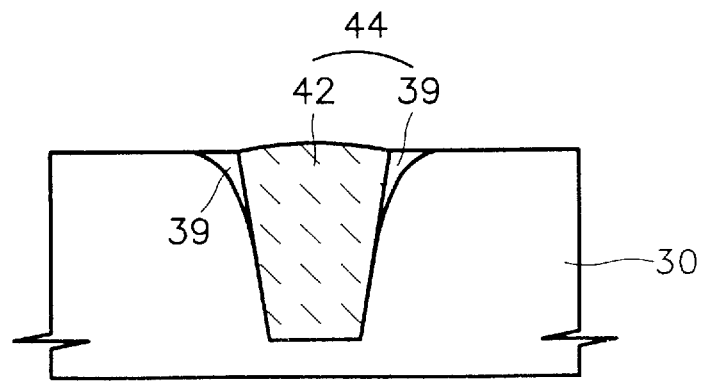

FIG. 2E is a sectional view of the intermediate structure after removing the etching stop layer pattern 34. As described with respect to FIG. 2D, the supplemental oxide film 39 is intact because the oxidation density of the surface of the first trench isolation region 42 is increased when the supplemental oxide film 39 is formed. Referring now to FIG. 2F, a sectional view of the resulting trench isolation region 44 is illustrated. Here, the resulting trench isolation region 44 is defined by removing the pad oxide film pattern 32 using conventional techniques. As will be understood by those skilled in the art, a part of the surface of the first trench isolation region 42 is etched during the removal of the pad oxide film pattern 32, but the supplemental oxide film 39 prevents the sidewall portion of the trench 36 from being exposed even if the first trench isolation region 42 is overetched. This is because the supplemental oxide film 39 is formed to be thick at the edge portion of the trench 36 and is formed of a material of higher density than the first trench isolation region 42 which means it is less susceptible to the wet etchant used to remove the pad oxide film pattern 32.

Referring now to FIGS. 3A–3E, methods of forming trench-based isolation regions according to a second embodiment of the present invention will be described. In particular, the steps illustrated by FIGS. 3B–3E are similar to the steps illustrated by FIGS. 2C–2F. However, as illustrated best by FIG. 3A, a buffer layer 38 of predetermined thickness is formed on the sidewalls and bottom of the trench 36 before the insulating material layer 40 is formed in the trench 36. As will be appreciated by those of ordinary skill in the art, the buffer layer 38 is formed on the sidewalls of the trench 36 by exposing the substrate 30 and trench 36 to an oxidizing atmosphere (e.g., $O_2$). The buffer layer 38 may be formed to prevent the sidewalls of the trench 36 from being damaged by impurity ions which may be implanted into the side of the trench 36. Here, the buffer layer 38 is formed of an oxide film by thermally oxidizing the trench 36. Also, the buffer layer 38 is formed to a thickness in a range between about 500 Å and 1,000 Å.

Figure 3A:
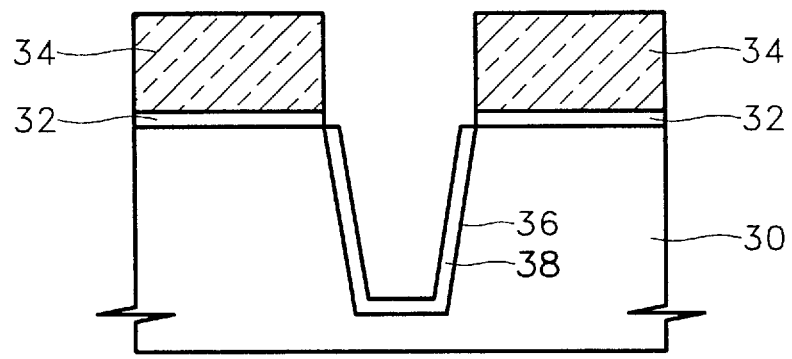
FIGS. 3A–3E illustrate schematic cross-sectional views of intermediate structures illustrating methods of forming trench-based isolation regions according to a second embodiment of the present invention.
Figure 3B:
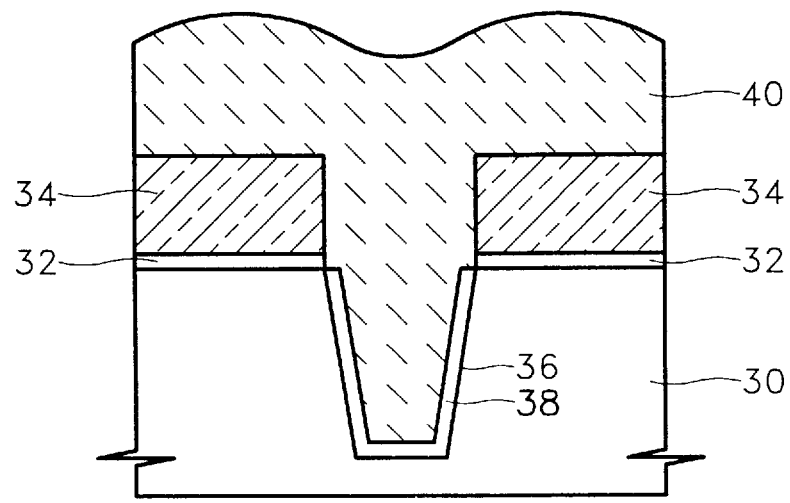
Figure 3C:
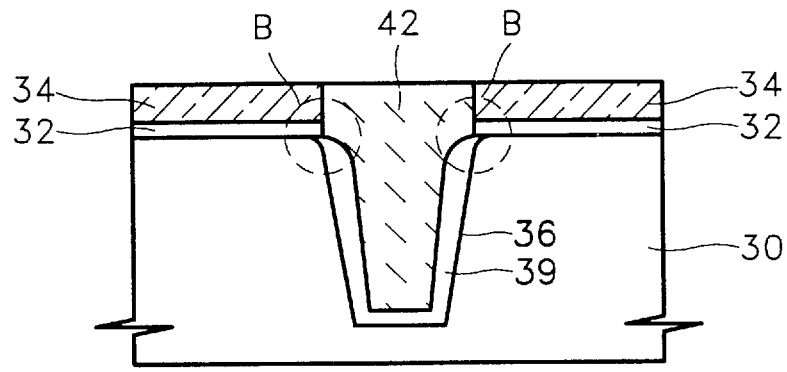

Thereafter, as illustrated by FIGS. 3B–3E, an insulating material layer 40 is formed in the trench 36 by depositing an insulating material on the entire surface of the substrate 30 having the trench 36 therein, to completely fill the trench 36. The insulating material layer 40 may be formed by depositing a layer of oxide using a chemical vapor deposition (CVD) technique. FIG. 3C shows the steps of converting the buffer layer 38 to a supplemental oxide film 39 by etching the insulating material layer 40 until the etching stop layer pattern 34 is exposed and a first trench isolation region 42 is defined and then exposing the substrate and first trench isolation region 42 to an atmosphere containing oxygen (e.g., $O_2$). The step of etching the insulating material layer 40 may be performed using a chemical-mechanical polishing (CMP) technique. At this time, the etching stop layer pattern 34 as well as the insulating material layer 40 of FIG. 3B are etched to a predetermined thickness.

Figure 3D:
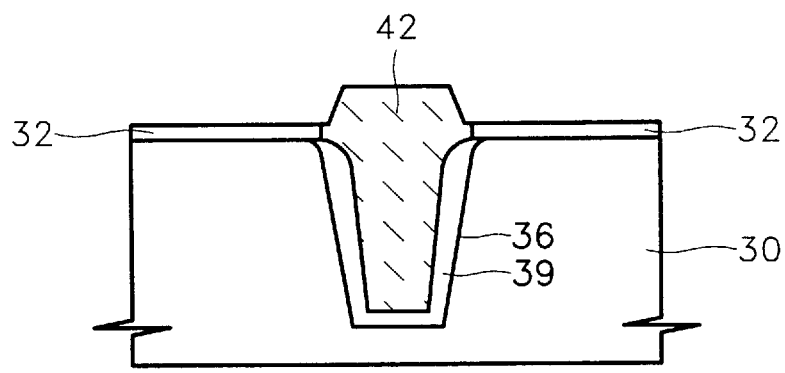

The supplemental oxide film 39 is preferably formed under conditions in which defects caused by stress are not further generated in the semiconductor substrate 30 or the first trench isolation region 42. In the present invention, the step of exposing the substrate 30 and the first trench isolation region 42 to an oxygen containing atmosphere is preferably performed at a temperature in the range between about 950° C. and 1,100° C. In particular, at a temperature of about 950° C., the oxide material may show visco-elastic behavior. Thus, the supplemental oxide film 39 may be able to compensate for any stresses which may be present in the etching stop layer pattern 34 and the first trench isolation region 42. Also, the supplemental oxide film 39 is formed to be sufficiently thick so that the semiconductor substrate 30 is not deteriorated and defects are not generated in the substrate 30 due to any possible volume expansion which might occur during the oxidation process for forming the supplemental oxide film 39. In the present invention, the supplemental oxide film 39 is formed to a thickness in the range of about 100 Å to 500Å, and more particularly to about 500Å. The supplemental oxide film 39 is formed to be thicker in the upper sidewall portions of the trench 36 than in the lower sidewall portions of the trench 36, as shown in FIG. 3C–3D. This is because the upper sidewall portions of the trench and substrate 30, close to the surface of the first trench isolation region 42, are more readily oxidized by oxygen atoms passing through the first trench isolation region 42. Accordingly, the profile of the edge portion of the active region (which is marked as region "B") shows a gradual slope, unlike conventional technology which results in a sharp edge (refer to FIGS. 1A to 1F).

The processing steps for forming the supplemental oxide film 39 and the effects of the supplemental oxide film 39 are as follows. First, it is possible to reduce the amount by which the first trench isolation region 42 is etched because the density of the oxide in the first trench isolation region 42 is increased when the supplemental oxide film 39 is formed. This means that the first trench isolation region 42 is not as easily etched by the wet etchant used to remove the etching stop layer pattern 34 and the pad oxide film pattern 32. Accordingly, the likelihood that the upper portions of the sidewalls of the trench 36 will be exposed during the wet etching step is reduced. Second, it is possible to make the edge portion of the active region rounded since the supplemental oxide film 39 on the upper sidewall portions (marked as region "B") of the trench 36 is formed to be thicker than on the other lower portions of the sidewalls of the trench 36. Thus, it is possible to reduce the magnitude of the electric fields concentrated on the edge portions of the active regions on opposing sides of the trench 36.

The forming conditions and the thickness of the supplemental oxide film 39 are most preferably restricted to the conditions set forth above, however, the preferred aspects of the present invention can be achieved if the supplemental oxide film 39 is formed under conditions and to a predetermined thickness so that defects are not generated in the first trench isolation region 42 and the semiconductor substrate 30.

Figure 3E:
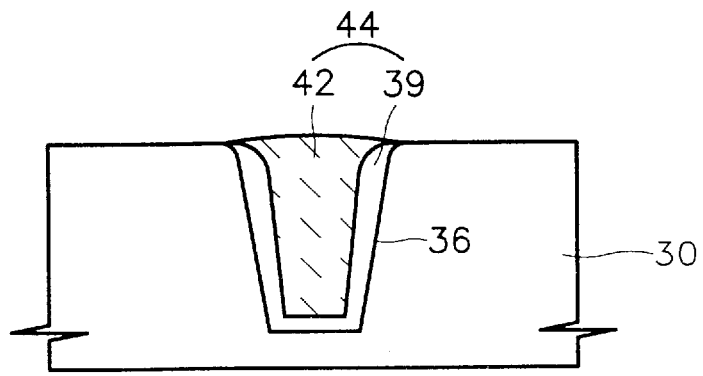

FIG. 3D is a sectional view of the intermediate structure after removing the etching stop layer pattern 34. As described with respect to FIG. 3C, the supplemental oxide film 39 is intact because the oxidation density of the surface of the first trench isolation region 42 is increased when the supplemental oxide film 39 is formed. Referring now to FIG. 3E, a sectional view of the resulting trench isolation region 44 is illustrated. Here, the resulting trench isolation region 44 is defined by removing the pad oxide film pattern 32 using conventional techniques. As will be understood by those skilled in the art, a part of the surface of the first trench isolation region 42 is etched during the removal of the pad oxide film pattern 32, but the supplemental oxide film 39 prevents the sidewall portion of the trench 36 from being exposed even if the first trench isolation region 42 is overetched. This is because the supplemental oxide film 39 is formed to be thick at the edge portion of the trench 36 and is formed of a material of higher density than the first trench isolation region 42 which means it is less susceptible to the wet etchant used to remove the pad oxide film pattern 32.

Accordingly, based on the above described steps, the profile at the edge portions of the active region can be rounded by forming the supplemental oxide film on the surface of the trench before removing the etching stop layer pattern and the pad oxide film pattern. The supplemental oxide film can also be used to prevent the sidewalls of the trench from being exposed when the etching stop layer and pad oxide film patterns are wet etched. Thus, it is possible to improve the electrical characteristics and the isolation characteristics of devices formed in the adjacent active regions by preventing the hump phenomenon, the inverse narrow width effect and the gate oxide thinning phenomenon.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an electrical isolation region in a semiconductor substrate, comprising the steps of:

forming a trench in a first face of a semiconductor substrate;

filling the trench with an electrically insulating region; and then forming a supplemental oxide region having a thickness in a range between about 100 Å and 500 Å at an interface between a sidewall of the trench and the electrically insulating region by exposing the electrically insulating region to an oxygen containing atmosphere.

2. The method of claim 1, wherein said step of forming a supplemental oxide region comprises exposing the electrically insulating region to an oxygen containing atmosphere at a temperature in a range between about 950° C. and 1100° C.

3. The method of claim 2, wherein said step of filling the trench comprises filling the trench with an electrically insulating region having a first density; and wherein said step of forming a supplemental oxide region comprises forming a supplemental oxide region having a second density greater than the first density.

4. The method of claim 1, wherein said step of filling the trench comprises filling the trench with an electrically insulating region having a first density; and wherein said step of forming a supplemental oxide region comprises forming a supplemental oxide region having a second density greater than the first density.

5. The method of claim 1, wherein said trench forming step comprises the steps of:

forming an etching stop layer on the face of the substrate;

patterning the etching stop layer to expose a portion of the face of the substrate; and etching the exposed portion of the face of the substrate to define the trench, using the patterned etching stop layer as an etching mask.

6. The method of claim 5, wherein said step of forming a supplemental oxide region is preceded by the step of planarizing the electrically insulating region using the etching stop layer as a etching stop.

7. The method of claim 2, wherein said trench forming step comprises the steps of:

forming an etching stop layer on the face of the substrate;

patterning the etching stop layer to expose a portion of the face of the substrate; and etching the exposed portion of the face of the substrate to define the trench, using the patterned etching stop layer as an etching mask.

8. The method of claim 7, wherein said step of forming a supplemental oxide region is preceded by the step of planarizing the electrically insulating region using the etching stop layer as a etching stop.

9. The method of claim 8, wherein said planarizing step comprises planarizing the electrically insulating region by chemically-mechanically polishing the electrically insulating region.

10. The method of claim 1, wherein said step of filling the trench with an electrically insulating region is preceded by the step of thermally oxidizing the sidewall of the trench to form a buffer layer thereon.

11. The method of claim 10, wherein said step of thermally oxidizing the sidewall of the trench comprises thermally oxidizing the sidewall of the trench to form a buffer layer having a thickness in a range between about 500 Å and 1000 Å.

12. The method of claim 11, wherein said step of filling the trench with an electrically insulating region comprises depositing an oxide layer into the trench.

13. A method of forming an electrical isolation region in a semiconductor substrate, comprising the steps of:

forming a trench in a first face of a semiconductor substrate;

filling the trench with an electrically insulating region having a first density; then etching the electrically insulating region; and then forming a supplemental oxide region having a thickness in a range between about 100 Å and 500 Å and having a second density greater than the first density, at an interface between a sidewall of the trench and the electrically insulating region, by exposing the electrically insulating region to an oxidizing atmosphere having a temperature in a range between about 950° C. and 1100° C.

14. The method of claim 13, wherein said step of forming a trench is preceded by the step of forming a pad oxide layer on the first face of the semiconductor substrate; and wherein said step of forming a supplemental oxide region comprises forming a supplemental oxide region at a first interface between a sidewall of the trench and the electrically insulating region and at a second interface between the first face of the substrate and the pad oxide layer.

15. The method of claim 13, wherein said step of filling the trench with an electrically insulating region comprises thermally oxidizing a sidewall of the trench and then depositing an isolation oxide into the trench.

* * * * *